United States Patent
Sugiyama

(10) Patent No.: US 10,622,341 B2
(45) Date of Patent: Apr. 14, 2020

(54) LIGHT TRANSMITTER-RECEIVER

(71) Applicant: Fujitsu Optical Components Limited, Kawasaki-shi, Kanagawa (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 15/164,342

(22) Filed: May 25, 2016

(65) Prior Publication Data
US 2017/0012710 A1   Jan. 12, 2017

(30) Foreign Application Priority Data

Jul. 10, 2015   (JP) ................................. 2015-139047

(51) Int. Cl.
| | | |
|---|---|---|
| *H01L 25/16* | (2006.01) | |
| *H01L 23/498* | (2006.01) | |
| *G02B 6/42* | (2006.01) | |
| *G02F 1/225* | (2006.01) | |
| *G02F 1/01* | (2006.01) | |

(Continued)

(52) U.S. Cl.
CPC .......... *H01L 25/167* (2013.01); *G02B 6/4279* (2013.01); *G02F 1/00* (2013.01); *G02F 1/0107* (2013.01); *G02F 1/0121* (2013.01); *G02F 1/225* (2013.01); *H01L 23/4985* (2013.01);

(Continued)

(58) Field of Classification Search
None
See application file for complete search history.

(56) References Cited

U.S. PATENT DOCUMENTS 5,076,796 A * 12/1991 Kusayanagi ........... H01R 23/68
439/83
5,774,614 A * 6/1998 Gilliland .............. G02B 6/4224
385/88

(Continued)

FOREIGN PATENT DOCUMENTS

| JP | 59-189270 | 12/1984 |
| JP | 61-88262 | 6/1986 |

(Continued)

OTHER PUBLICATIONS

Khanpur, R. S., Printed circuit Boards: Design, Fabrication, Assembly and Testing, 2005, Tata McGraw-Hill Publishing Company Limited, pp. 1-10.*

(Continued)

*Primary Examiner* — Jai M Lee
(74) *Attorney, Agent, or Firm* — Staas & Hasley LLP

(57) ABSTRACT

A light transmitter-receiver includes a signal processor that carries out a process of transmitting or receiving a light signal; a rigid substrate that is in a plate shape and that has a first through-hole terminal; a package that is fixed to the rigid substrate, that accommodates the signal processor, and that includes a second terminal disposed on a side wall of the package and electrically coupled to the signal processor; and a flexible substrate that extends along the side wall and that includes a third terminal disposed at an tip of the flexible substrate and electrically coupled to the second terminal, the third terminal being coupled to the first through-hole terminal in a state where the third terminal is placed in the first through-hole terminal.

9 Claims, 19 Drawing Sheets

(51) Int. Cl.
*G02F 1/00* (2006.01)
*H04B 10/50* (2013.01)

(52) U.S. Cl.
CPC ...... *H01L 23/49827* (2013.01); *G02B 6/4281* (2013.01); *H04B 10/50* (2013.01); *H04B 10/505* (2013.01)

(56) References Cited

U.S. PATENT DOCUMENTS

| | | | | |
|---|---|---|---|---|
| 6,203,212 | B1* | 3/2001 | Rosenberg | G02B 6/4201 385/49 |
| 7,011,458 | B2* | 3/2006 | Kagaya | G02F 1/0121 359/237 |
| 7,130,100 | B2* | 10/2006 | Kagaya | G02F 1/0121 359/237 |
| 7,471,520 | B2* | 12/2008 | Schwiebert | H01L 23/66 361/760 |
| 7,936,448 | B2* | 5/2011 | Albuquerque | G01S 7/4811 356/4.01 |
| 8,218,973 | B2* | 7/2012 | Kagaya | H04B 10/2504 398/164 |
| 8,437,583 | B2* | 5/2013 | Ban | G02B 6/4201 385/14 |
| 10,001,693 | B2* | 6/2018 | Sugiyama | G02F 1/225 |
| 2005/0018994 | A1* | 1/2005 | Riaziat | G02B 6/4201 385/147 |
| 2008/0253720 | A1* | 10/2008 | Yamaguchi | G02B 6/4201 385/89 |
| 2009/0302956 | A1* | 12/2009 | Matsuura | H03L 1/022 331/94.1 |
| 2010/0006863 | A1* | 1/2010 | Ban | H01L 31/0203 257/81 |
| 2010/0061736 | A1* | 3/2010 | Kawaguchi | H05K 1/0234 398/139 |
| 2011/0008056 | A1* | 1/2011 | Yagisawa | G02B 6/4201 398/182 |
| 2012/0051683 | A1* | 3/2012 | Sugiyama | G02F 1/035 385/1 |
| 2013/0027762 | A1* | 1/2013 | Sugiyama | H05K 1/0215 359/245 |
| 2014/0203175 | A1* | 7/2014 | Kobrinsky | G02B 6/428 250/214.1 |
| 2016/0011488 | A1* | 1/2016 | Sugiyama | G02F 1/0121 398/188 |

FOREIGN PATENT DOCUMENTS

| | | |
|---|---|---|
| JP | 61-173163 | 10/1986 |
| JP | 2004-128990 | 4/2004 |
| JP | 2004-264842 | 9/2004 |
| JP | 2008071784 A * | 3/2008 |
| JP | 2011-15200 | 1/2011 |
| JP | 2011-222826 | 11/2011 |
| JP | 2012-48121 | 3/2012 |

OTHER PUBLICATIONS

Minco, Flex Circuits Design Guide, Apr. 2015.*
Japanese Office Action dated May 23, 2017, in corresponding Japanese Patent Application No. 2015-139047.

* cited by examiner

FIG. 7
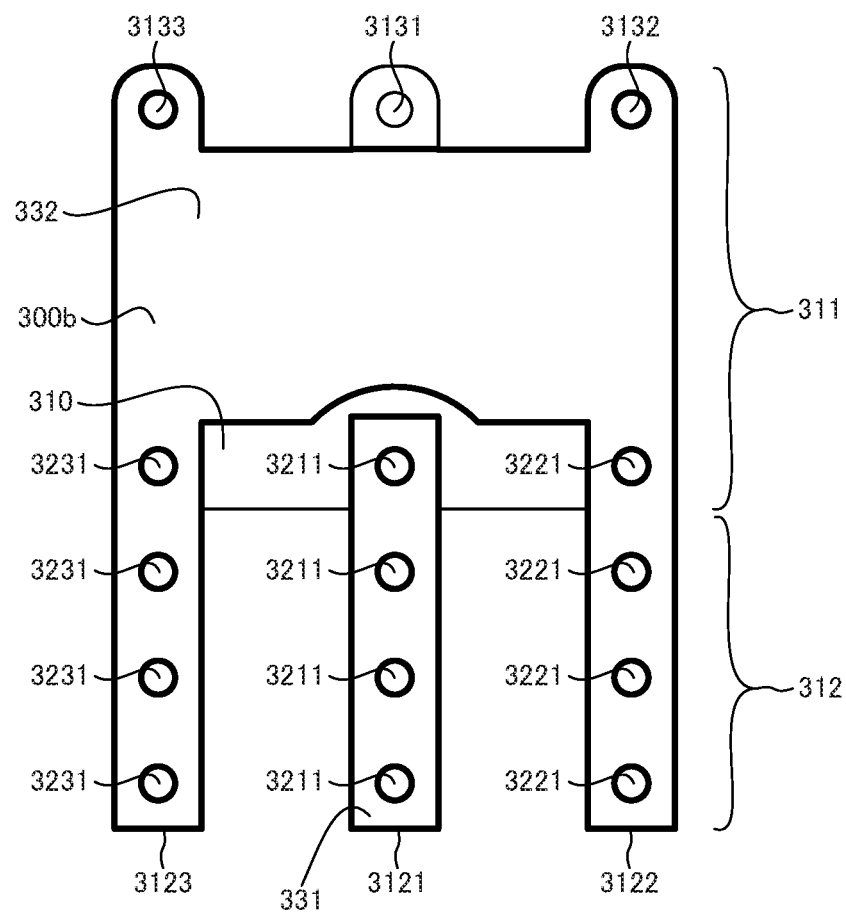
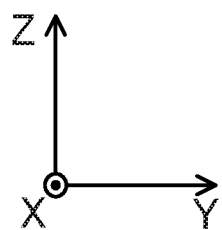

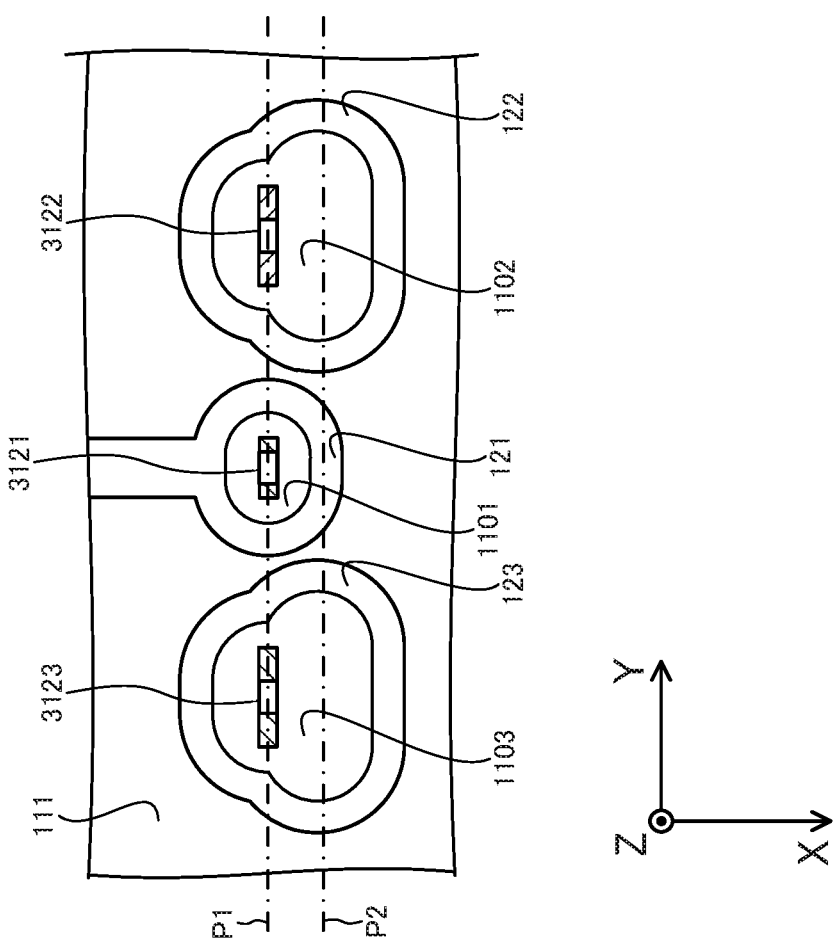

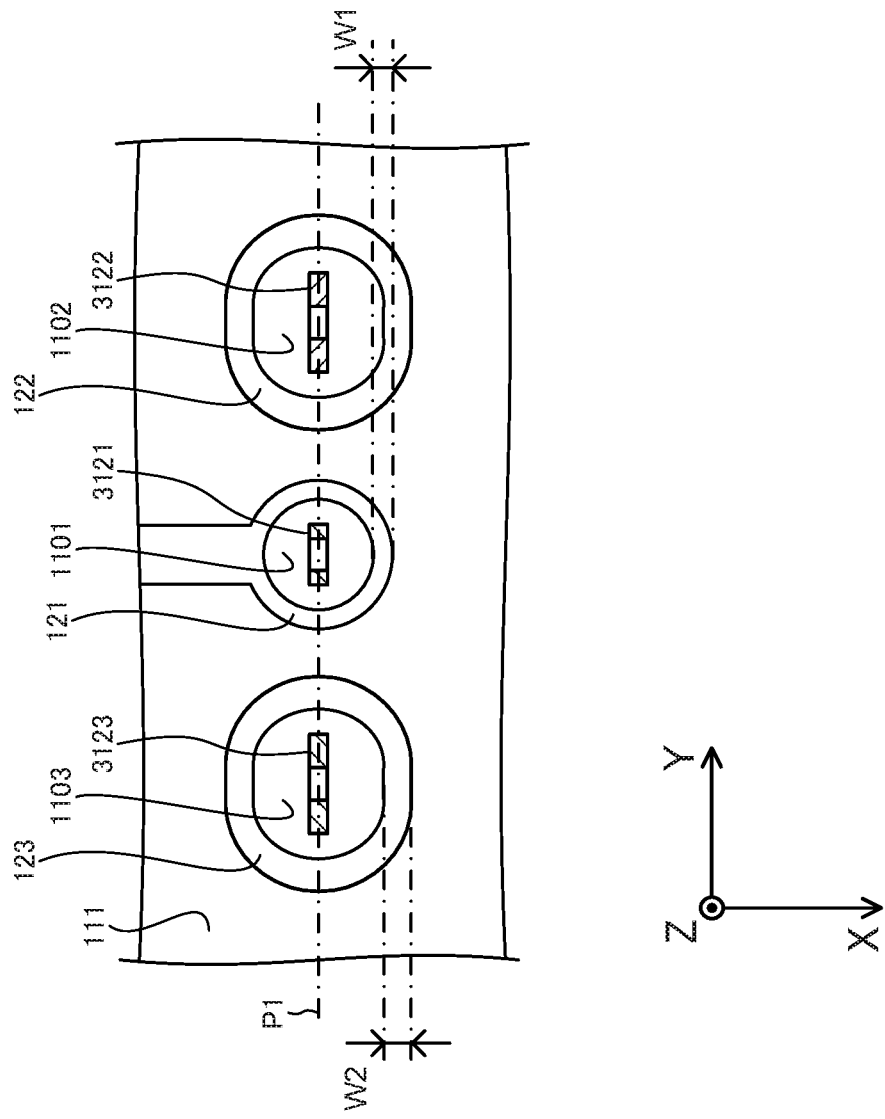

LIGHT TRANSMITTER-RECEIVER

CROSS-REFERENCE TO RELATED APPLICATION

This application is based upon and claims the benefit of priority of the prior Japanese Patent application No. 2015-139047, filed on Jul. 10, 2015, the entire contents of which are incorporated herein by reference.

FIELD

The embodiments discussed herein is related to a light transmitter-receiver.

BACKGROUND

One of the light transmitter-receivers known to public includes a rigid substrate and a package accommodating a light modulator that modulates, based on a signal input from the rigid substrate, light (see, for example, Patent Literature 1). As illustrated in FIG. 1, a light transmitter-receiver 90 includes a flexible substrate 95 that couples a first terminal 92 being provided on the surface of a rigid substrate 91 and a second terminal 94 protruding from a side wall of a package 93.

One end 96 of the flexible substrate 95 is coupled to the second terminal 94. A third terminal 98 is disposed on the surface of the other end 97 of the flexible substrate 95. The flexible substrate 95 is bent in such a posture that the third terminal 98 comes into contact with the first terminal 98 under a state where the third terminal 98 is positioned in parallel with the first terminal 92. Consequently, the third terminal 98 is coupled to the first terminal 92.

PRIOR ART REFERENCE

Patent Literature

[Patent Literature 1] Japanese Laid-open Patent Publication No. 2012-48121

SUMMARY

In the above light transmitter-receiver 90, it is difficult to appropriately bend the flexible substrate 95 unless the first terminal 92 is arranged at a predetermined distance d from the package 93. This arrangement may sometimes excessively increase the area of a region used to couple a terminal of the package 93 and a terminal of the rigid substrate 91.

As an aspect, there is provided a light transmitter-receiver including: a signal processor that carries out a process of transmitting or receiving a light signal; a rigid substrate that is in a plate shape and that has a first through-hole terminal; a package that is fixed to the rigid substrate, that accommodates the signal processor, and that includes a second terminal disposed on a side wall of the package and electrically coupled to the signal processor; and a flexible substrate that extends along the side wall and that includes a third terminal disposed at an tip of the flexible substrate and electrically coupled to the second terminal, the third terminal being coupled to the first through-hole terminal in a state where the third terminal is placed in the first through-hole terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a diagram illustrating an example of a back view of a flexible substrate of FIG. 5;

FIG. 18 is a diagram illustrating an example of a cross section of a transmitter according to the fifth modification to the first embodiment, the cross section corresponding to that of FIG. 13; and FIG. 19 is a diagram illustrating an example of a cross section of a transmitter according to a sixth modification to the first embodiment, the cross section corresponding to that of FIG. 13.

DESCRIPTION OF EMBODIMENTS

Hereinafter, description will now be made in relation to an embodiment with reference to the drawings. The following embodiment is exemplary, so there is no intention to exclude application of various modifications and techniques not suggested in the following description to the embodiments. Throughout accompanying drawings of the embodiments, like reference numbers designate the same or substantially identical parts and elements unless changes and modification are specified.

First Embodiment (Configuration)

Figure 1:
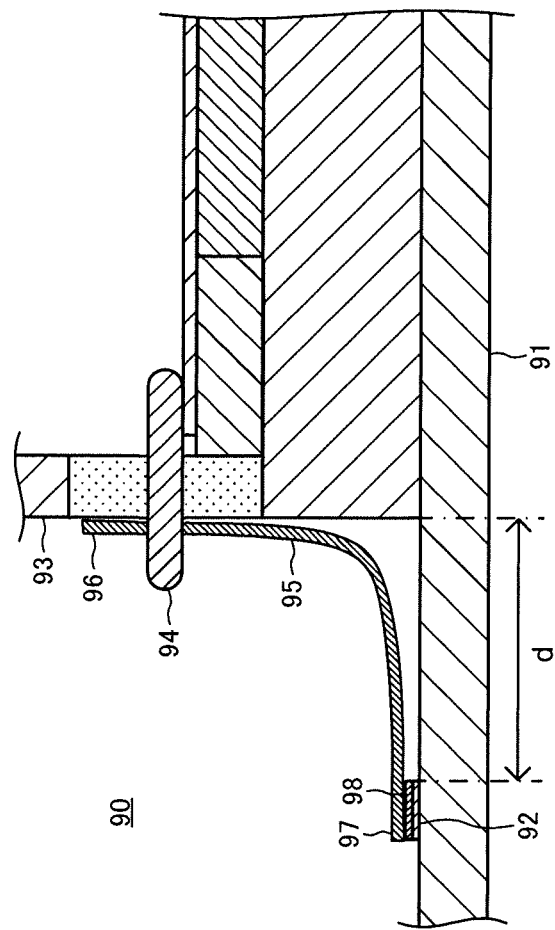
FIG. 1 is a diagram illustrating an example of coupling of a terminal of a package and a terminal of a rigid substrate.
Figure 2:
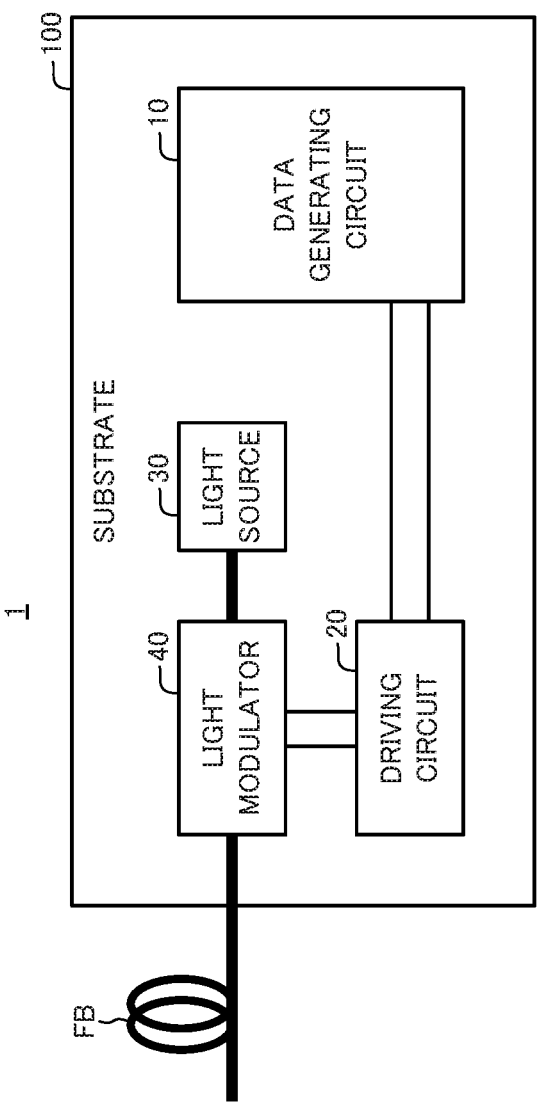
FIG. 2 is a block diagram illustrating an example of the configuration of a transmitter according to a first embodiment.

As illustrated in FIG. 2, a transmitter 1 of the first embodiment generates a light signal and transmits the generated light signal to a receiver. The transmitter 1 is an example of a light transmitter-receiver. In this embodiment, the transmitter 1 includes a rigid substrate 100, which is an example of a first substrate and which takes a shape of a flat plate. The rigid substrate 100 includes a data generating circuit 10, a driving circuit 20, a light source 30, and a light modulator 40.

The data generating circuit 10 generates data and outputs the generated data to the driving circuit 20. The driving circuit 20 generates a driving signal to drive the light modulator 40 on the basis of the data input from the data generating circuit 10 and outputs the generated driving signal to the light modulator 40. The driving signal of this embodiment is a Radio Frequency (RF) signal.

The light source 30 generates light and outputs the generated light to the light modulator 40. Examples of the light source 30 is a semiconductor laser, such as a distributed feedback laser, and a laser diode.

The light modulator 40 modulates the light input from the light source 30 on the basis of the driving signal input from the driving circuit 20 and transmits the modulated light to the destination through a communication cable FB. The communication cable FB of this embodiment includes an optical fiber, which is exemplified by a Single Mode Fiber (SMF). The modulated light is an example of a light signal.

In this embodiment, the light modulator 40 is mounted on the rigid substrate 100. For example, as illustrated in FIG. 3, which depicts the cross section of the light modulator 40 cut along a plane parallel to the rigid substrate 100, the light modulator 40 includes a package 401, an input-end connector 402, a modulator 403, an output-end connector 404, a relay 405, and a terminal 406.

The package 401 is fixed to the rigid substrate 100. The package 401 contains the modulator 403, the relay 405, and the terminal 406. The package 401 of this embodiment takes the form of a cuboid. The package 401 may be referred to as a casing. The package 401 of this embodiment has side walls each forming a plane perpendicular to the rigid substrate 100. This means that the package 401 is vertically arranged on the rigid substrate 100. The side walls of the package 401 may be referred to as the side faces of the package 401. The package 401 of this embodiment is made of a conductor (e.g., metal).

Figure 3:
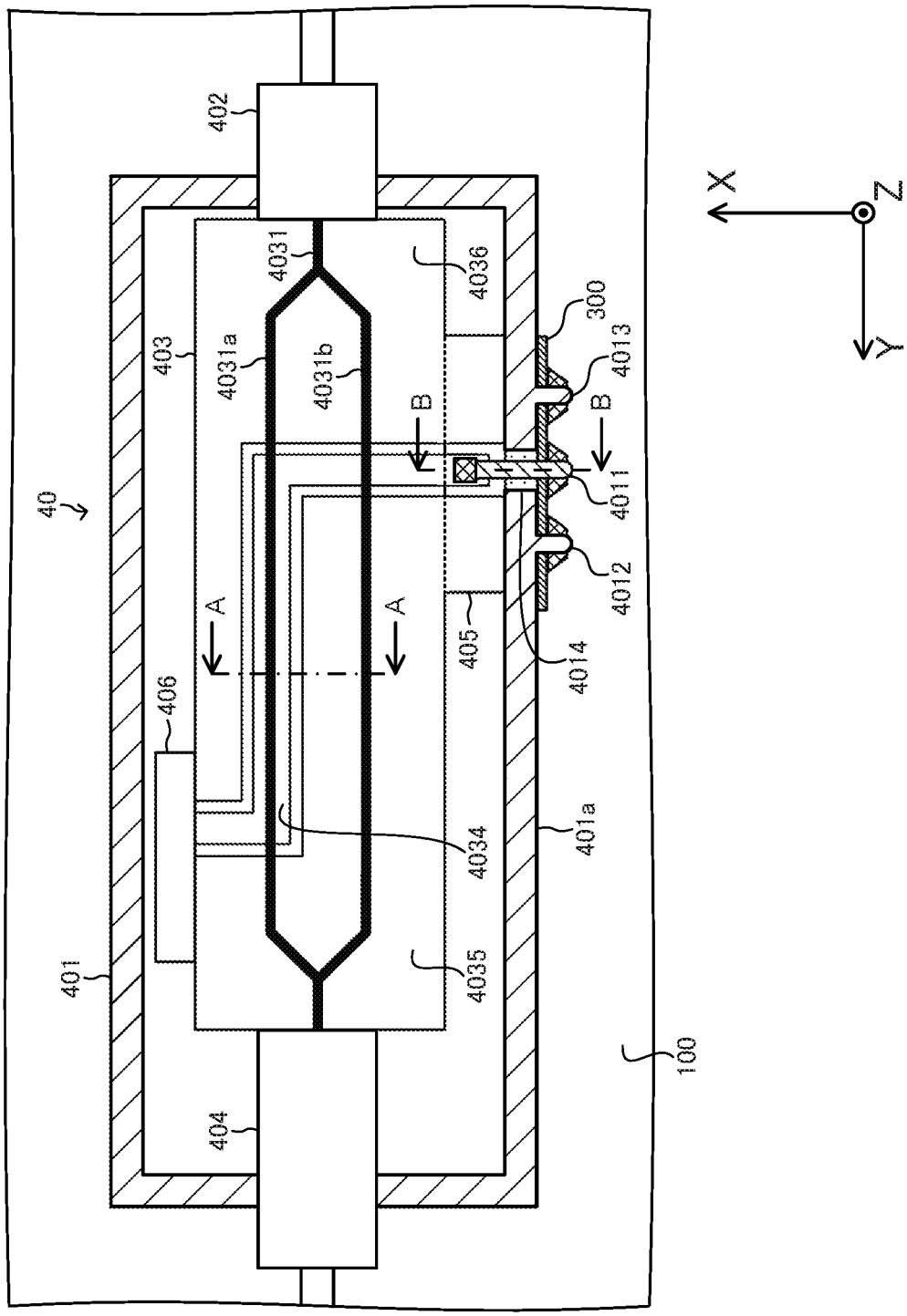
FIG. 3 is a diagram illustrating an example of a cross section of a light modulator of FIG. 2.

As illustrated in FIG. 3, the description of the transmitter 1 uses the right-handed orthogonal coordinate system having the X axis, the Y axis, and the Z axis. The Z axis extends along the direction perpendicular to the rigid substrate 100 (i.e., in the thickness direction of the rigid substrate 100). The positive Z-axis direction extends from the rigid substrate 100 to the package 401. The Y axis extends along the long side of the package 401 on the cross section of the light modulator 40 cut by a plane parallel to the rigid substrate 100. The X axis extends along the short side of the package 401 on the cross section of the light modulator 40 cut by a plane parallel to the rigid substrate 100. FIGS. 4-19 that are described below use the same right-handed orthogonal coordinate system as that in FIG. 3 in this example.

The input-end connector 402 receives the light output from the light source 30, and then outputs the received light to the modulator 403.

The modulator 403 modulates light using a Mach-Zehnder interferometer. In other words, the light modulator 40 is a Mach-Zehnder light modulator.

Figure 4:
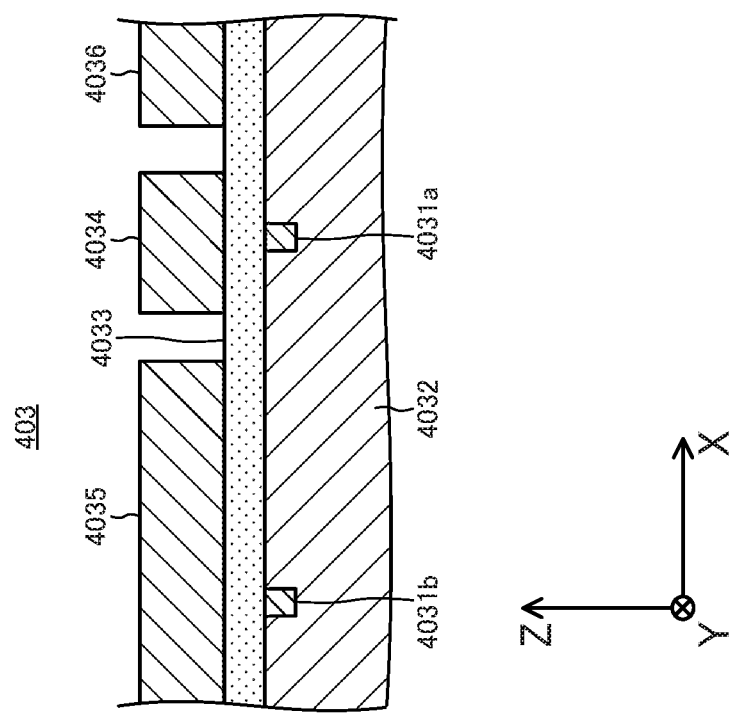
FIG. 4 is a diagram illustrating an example of a cross section of the light modulator of FIG. 3 cut by line A-A.

For example, as illustrated in FIGS. 3 and 4, the modulator 403 includes light waveguide 4031, a substrate 4032, a buffer layer 4033, a signal electrode 4034, and ground electrodes 4035 and 4036. FIG. 4 illustrates the cross section of in FIG. 3 cut by line A-A.

The substrate 4032 has electric-optical crystal. For example, the material of the substrate 4032 contains $LiNbO_3$ or $LiTaO_2$ as a principal component.

The light waveguide 4031 may be formed by forming a metal layer of, for example, titanium (Ti) on a part of the substrate 4032 and then thermally diffusing the metal. Alternatively, the light waveguide 4031 may be formed by patterning followed by proton exchange in benzoic acid.

As illustrated in FIG. 3, the light waveguide 4031 branches into two light waveguides 4031a and 4031b parallel with each other in the vicinity of the input-end connector 402. The two light waveguides 4031a and 4031b join in the vicinity of the output-end connector 404.

As illustrated in FIG. 4, the buffer layer 4033 is in contact with a face of the substrate 4032 on the positive side of the Z axis. In this embodiment, the buffer layer 4033 is formed of an insulator, such as $SiO_2$. The buffer layer 4033 has a length (i.e., the thickness) along the Z axis of, for example, 0.2 μm to 2 μm. The presence of the buffer layer 4033 makes it possible to inhibit the electrodes 4034-4036 from absorbing the light propagating through the light waveguide 4031.

As illustrated in FIG. 4, the electrodes 4034-4036 are in contact with a face of the buffer layer 4033 on the positive side of the Z axis. The signal electrode 4034 is mainly positioned in the region covering a straight line passing through the light waveguide 4031a and extending along the Z axis.

As illustrated in FIGS. 3 and 4, the ground electrodes 4035 and 4036 are positioned so as to sandwich the signal electrode 4034 at a predetermined distance on the plane (i.e., XY plane) perpendicular to the Z axis. Accordingly, the electrodes 4034-4036 can be regarded as a coplanar transmission path. As illustrated in FIG. 4, the ground electrodes 4035 and 4036 are mainly positioned in the region covering a straight line passing through the light waveguide 4031b and extending along the Z axis.

Into the signal electrode 4034, a driving signal from the driving circuit 20 is input, as to be detailed below.

The terminal 406 terminates the driving signal input into the signal electrode 4034. In this embodiment, the terminal 406 connects the signal electrode 4034 to the ground electrodes 4035 and 4036 via a resistor.

With this configuration, the modulator 403 changes the difference of the phases of light propagating through the light waveguide 4031a and the light waveguide 4031b. The modulator 403 generates a light signal having a modulated intensity.

The modulator 403 outputs the modulated light signal to the output-end connector 404. The modulator 403 is an example of a signal processor that carries out a transmission process on a light signal.

The output-end connector 404 transmits the light signal input form the modulator 403 to the destination through the communication cable FB.

The relay 405 is positioned between the modulator 403 and the package 401. The electrodes 4034-4036 extend from the modulator 403 to the relay 405 on the face of the relay 405 on the positive side of the Z axis. The ground electrodes 4035 and 4036 are electrically coupled to the package 401.

Figure 5:
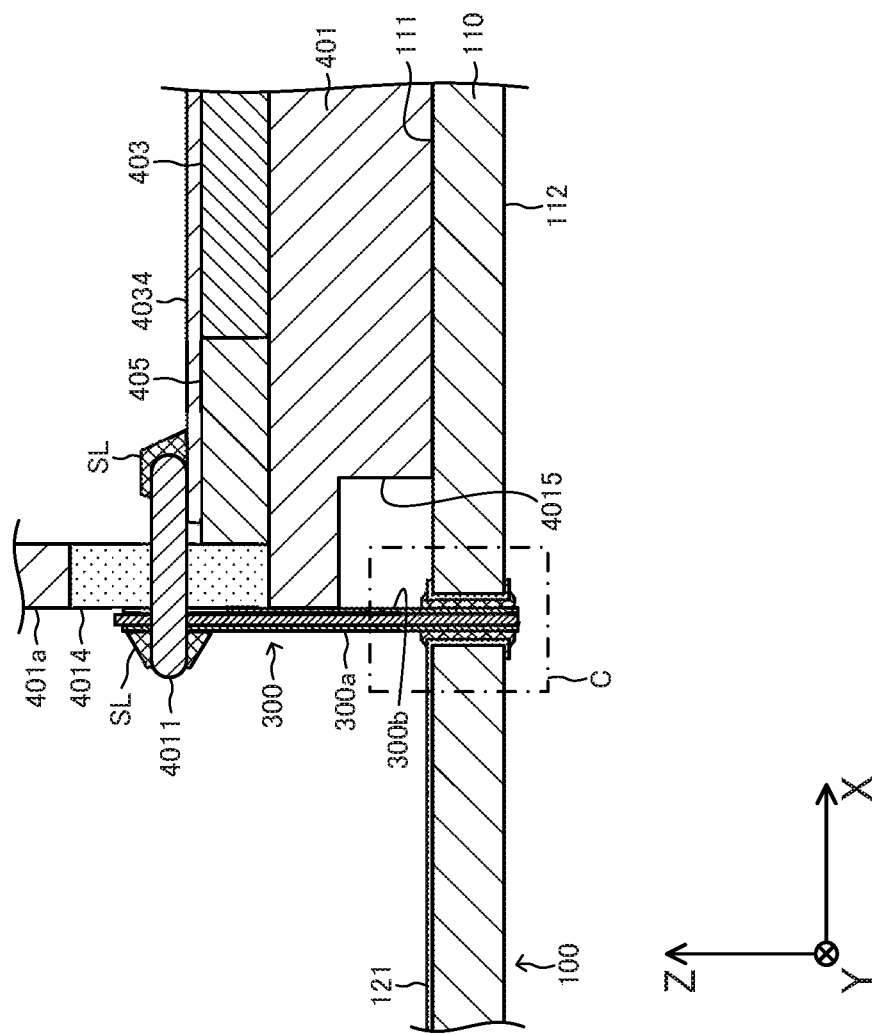
FIG. 5 is a diagram illustrating an example of a cross section of a transmitter of FIG. 3 cut by line B-B.

As illustrated in FIGS. 3 and 5, the package 401 includes a lead pin 4011. The signal electrode 4034 is electrically coupled to the lead pin 4011 with soldering SL. FIG. 5 depicts the cross section of the transmitter 1 cut by the B-B line of FIG. 3. The lead pin 4011 is an example of a second terminal.

As illustrated in FIGS. 3 and 5, the light modulator 40 has a window 4014 on a side wall 401a of the package 401 on the negative side of the X axis. The window 4014 is formed of an insulator, such as glass. The lead pin 4011 penetrates the window 4014 to externally project from the package 401.

As illustrated in FIG. 3, the side wall 401a of the package 401 on the negative side of the X axis includes two protrusions 4012 and 4013. The protrusion 4013, the lead pin 4011, and the protrusion 4012 are arranged in this sequence in the positive direction of the Y axis along the Y axis. The protrusion 4013, the lead pin 4011, and the protrusion 4012 are arranged at equal intervals along the Y axis.

As illustrated in FIGS. 3 and 5, the transmitter 1 includes a flexible substrate 300 that electrically couples the package 401 to the rigid substrate 100. The flexible substrate 300 is an example of a second substrate. The flexible substrate 300 takes a form of a flexible sheet. The flexible substrate 300 may also referred to as a Flexible Printed Circuit (FPC).

Figure 6:
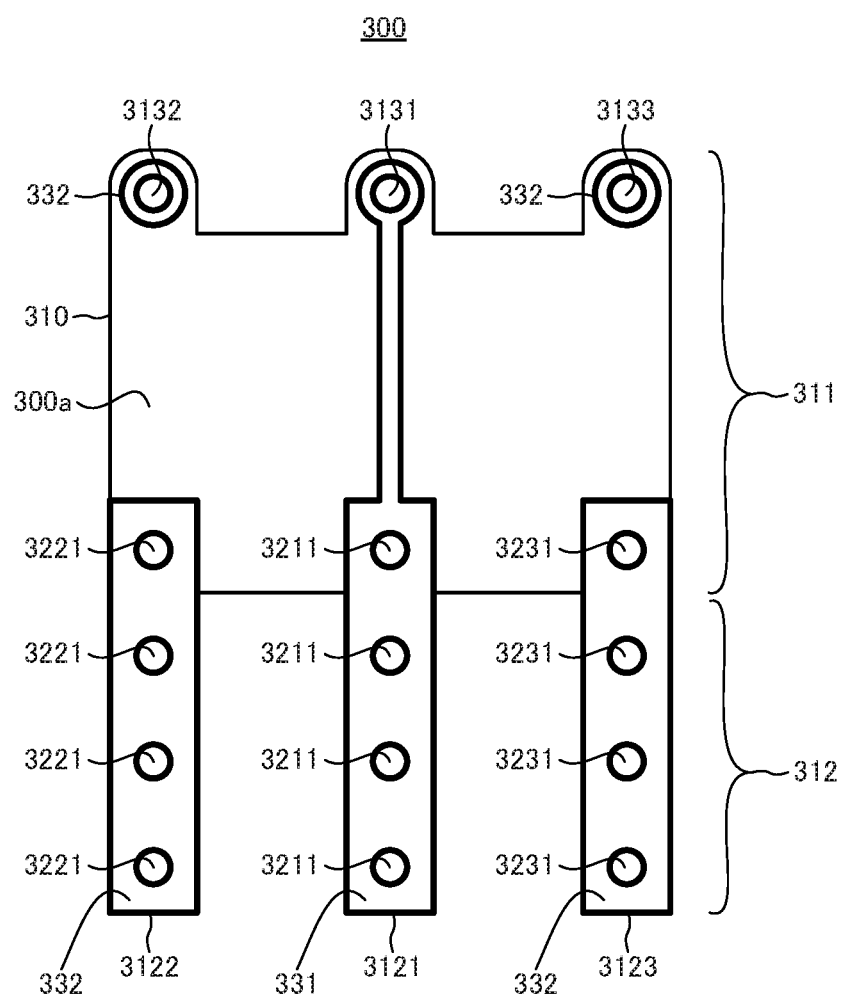
FIG. 6 is a diagram illustrating an example of a front view of a flexible substrate of FIG. 5.

For example, as illustrated in FIGS. 6 and 7, the flexible substrate 300 includes a body 310 and conductive layers 331 and 332 each partially covering the surface of the body 310. In this embodiment, the body 310 is formed of an insulator. The conductive layer 331 is an example of a third terminal and the conductive layer 332 is an example of a fifth terminal.

FIG. 6 illustrates the flexible substrate 300 when the transmitter 1 is seen in the positive direction of the X axis; and FIG. 7 illustrates the flexible substrate 300 when the transmitter 1 is seen in the negative direction of the X axis.

The body 310 includes a rectangular base 311 and a terminal group 312 extending from the negative end of the Z axis of the base 311 in the negative direction of the Z axis. In other words, the terminal group 312 forms the tip of the base 311 on the negative end of the Z axis. The terminal group 312 includes three terminals 3121 to 3123. The terminal 3121 is positioned in the center in the direction of Y axis among the three terminals 3121 to 3123. The terminals 3122 and 3123 are positioned on the both ends along the direction of the Y axis.

The three terminals 3121-3123 of this embodiment have the same length along the Y axis. The length of the terminals 3121-3123 along the Y axis is shorter than the length of the base 311 on the negative end of the Z axis along the Y axis. This means that the terminals 3121-3123 extend from a part of the negative end of the base 311 of the Z axis.

In particular, the three terminals 3121-3123 have the same length along the Z axis in this embodiment.

The base 311 includes three through-holes 3131-3133 on the positive end of the Z axis and on the positions on the straight lines passing through the terminals 3121-3123 and extending along the Z axis.

The base 311 further includes through-holes 3211-3231 on the negative end of the Z axis on the positions on the straight lines passing though the terminals 3121-3123 and extending along the Z axis.

In addition, the terminals 3121-3123 have penetrating holes 3211-3231, respectively. In this embodiment, the multiple through-holes 3211 are arranged at equal intervals along the direction of the Z axis, and the multiple through-holes 3221 and the through-holes 3231 are arranged likewise.

As illustrating in FIG. 6, the conductive layer 331 is positioned on the terminal 3121 and also in the vicinity of the through-hole 3211 of the base 311 and the through-hole 3131 of the base 311 on a surface 300a on the negative side of the flexible substrate 300 in the direction of the X axis. Furthermore, the conductive layer 331 is positioned in a region connecting the terminal 3121 and a portion near the through-hole 3131 of the base 311 on the surface 300a on the negative side of the flexible substrate 300 in the direction of the X axis.

As illustrated in FIG. 7, the conductive layer 331 is positioned on the terminal 3121 and also in the vicinity of the through-holes 3211 of the base 311 on the surface 300b of the positive side of the flexible substrate 300 in the direction of the X axis. Furthermore, the conductive layer 331 is positioned on a wall of the body 310 having the through-holes 3211.

As illustrated in FIG. 6, the conductive layer 332 is positioned on the terminal 3122 and also in the vicinity of the through-holes 3221 of the base 311 and the through-hole 3132 of the base 311 on the surface 300a of the negative side of the flexible substrate 300 in the direction of the X axis. Furthermore, the conductive layer 332 is positioned on the terminal 3123 and also in the vicinity of the through-hole 3231 on the base 311 and the through-hole 3133 on the bas 311 on the surface 300a of the negative side of the flexible substrate 300 in the direction of the X axis.

As illustrated in FIG. 7, the conductive layer 332 is positioned on the terminal 3122 and also in the vicinity of the terminal 3122, the through-holes 3221 of the base 311, and the through-hole 3132 of the base 311 on the surface 300b on the positive side of the 300 in the direction of the X axis. Further, the conductive layer 332 is positioned on the terminal 3123 and also in the vicinity of the through-holes 3231 of the base 311 and the through-hole 3133 of the base 311 on the surface 300b of the positive side of the flexible substrate 300 in the direction of the X axis.

In addition, the conductive layer 332 is positioned on a region connecting the terminal 3122, a portion near the terminal 3132 of the base 311, the terminal 3123, and a portion near the terminal 3133 of the base 311 on the surface 300b on the positive side of the flexible substrate 300 in the direction of the X axis.

Furthermore, the conductive layer 332 is located on a wall of the body 310 which wall has the through-holes 3221, 3231, 3132, and 3133.

As illustrated in FIG. 5, the side wall 401a of the package 401 has a recess 4015 at the negative end of the Z axis. The recess 4015 is positioned on a region including a straight line that passes through the protrusion 4013, the lead pin 4011, and the protrusion 4012 and that extends in the direction of the Z axis.

Figure 8:
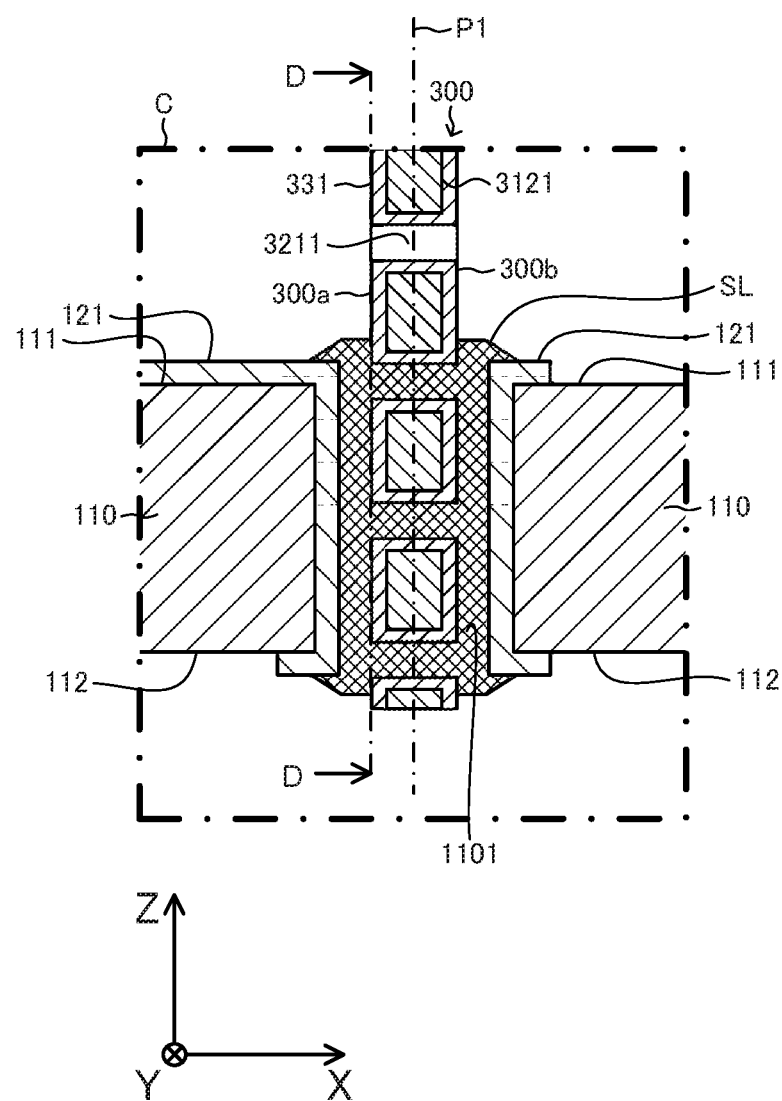
FIG. 8 is an enlargement view of the region C of FIG. 5.
Figure 9:
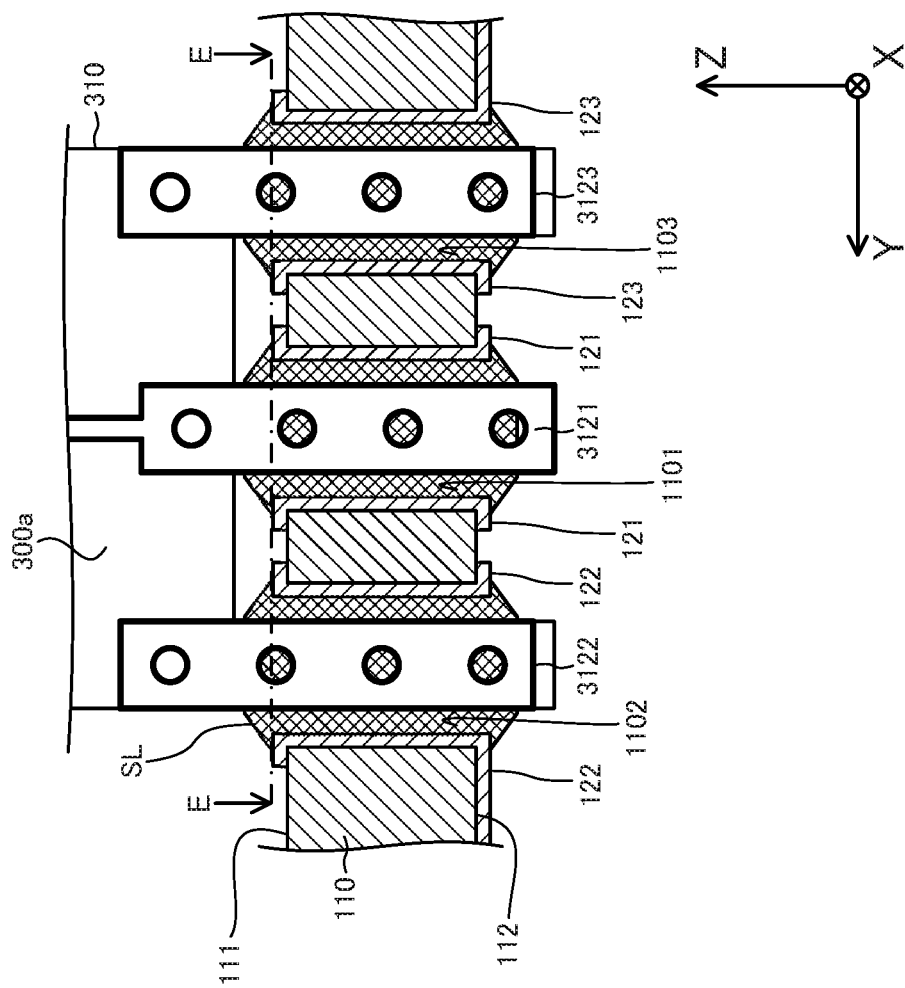
FIG. 9 is a diagram illustrating an example of a cross section of a transmitter of FIG. 8 cut by line D-D.
Figure 10:
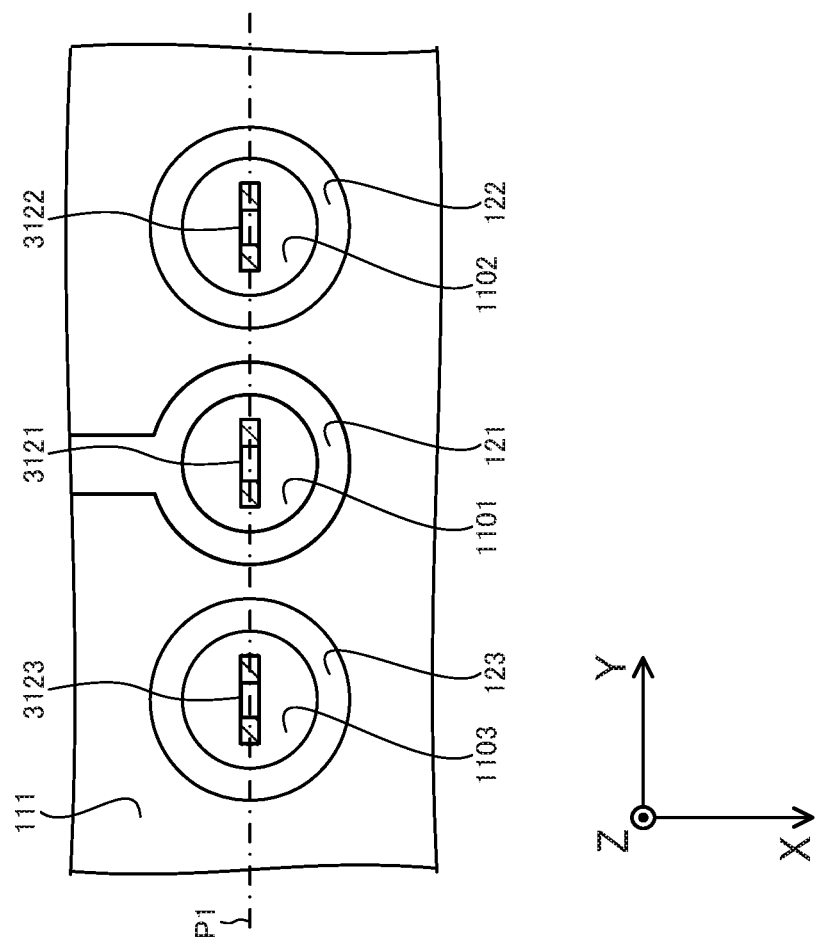
FIG. 10 is a diagram illustrating an example of a cross section of a transmitter of FIG. 9 cut by line E-E.

As illustrated in FIGS. 5, 8, and 10, the rigid substrate 100 includes a body 110, the conductive layers 121-123 each partially covering the part of the surface of the body 110. The rigid substrate 100 has through-holes 1101-1103. FIG. 8 is an enlarged view of the region C of FIG. 5. FIG. 9 is a cross section of the transmitter 1 cut along the line D-D of FIG. 8, and FIG. 10 is a cross section of the transmitter 1 cut along the line E-E of FIG. 8. FIG. 10 omits illustration of soldering.

The through-hole 1101 is an example of the first through-hole. The conductive layer 121 is an example of a first terminal, which may also be referred to as a first through-hole terminal. The through-holes 1102 and 1103 are examples of a second through-hole. The conductive layers 122 and 123 are examples of a fourth terminal, which may also be referred to as a fourth through-hole terminal.

As illustrated in FIGS. 8 and 10, the through-holes 1101-1103 each take a form of a column. The through-holes 1101-1103 each have a central axis positioned on a plane P1 extending along the side wall 401a of the package 401. The through-hole 1101 is positioned in a region including a straight line passing through the lead pin 4011 and extending in the direction of the Z axis. The through-hole 1102 and 1103 are positioned in regions including straight lines passing through the protrusions 4012 and 4013, respectively, and extending in the direction of the Z axis.

In this embodiment, as illustrated in FIG. 10, the through-holes 1101-1103 have the same diameter. The diameters of the through-holes 1101-1103 are longer by a predetermined margin than the length of through-holes 1101-1103 in the direction of the Y axis.

As illustrated in FIGS. 9 and 10, the conductive layers 121-123 are positioned in the vicinity of the through-holes 1101-1103, respectively, on the surface 111 of the body 110 on the positive side in the direction of the Z axis. In this embodiment, the conductive layers 121-123 have the predetermined widths and form the outer circumferences of the penetrating holes 1101-1103, respectively, on the surface 111 of the body 110 on the positive side in the direction of the Z axis. The conductive layers 121-123 may also be referred to as lands.

In this embodiment, the conductive layers 121-123 have the same width.

As illustrated in FIG. 9, the conductive layers 121-123 are positioned in the vicinity of the through-holes 1101-1103, respectively, on the surface 112 of the body 110 on the negative side in the direction of the Z axis. In this embodiment, the conductive layers 121-123 have the above width on the surface 112 of the body 110 on the negative side in the direction of the Z axis and form the outer circumferences of the through-holes 1101-1103, respectively.

As illustrated in FIG. 9, the conductive layers 121-123 are positioned on the wall of the body 110 that forms the through-holes 1101-1103.

As illustrated in FIG. 5, the lead pin 4011, being in a state of penetrating the flexible substrate 300 through the through-hole 3131, is electrically coupled to the conductive layer 331 by soldering SL. Likewise, the protrusions 4012 and 4013, being in a state of penetrating the flexible substrate 300 through the through-holes 3132 and 3133, respectively, are electrically coupled to the conductive layer 332 by soldering SL.

Furthermore, as illustrated in FIG. 9, the conductive layer 331 of the flexible substrate 300, being in a state where the terminal 3121 penetrates the rigid substrate 100 through the through-hole 1101, is electrically coupled to the conductive layer 121 by soldering SL. Accordingly, the through-hole 1101 of this embodiment accommodates part of the terminal 3121 on the plane P1 extending along the side wall 401a of the package 401.

Likewise, the conductive layer 332 of the flexible substrate 300, being in a state where the terminals 3122 and 3123 penetrates the rigid substrate 100 through the through-holes 1102 and 1103, respectively are electrically coupled to the conductive layers 122 and 123, respectively, by soldering SL. Accordingly, the through-holes 1102 and 1103 of this embodiment accommodate part of the terminals 3122 and 3123 on the plane P1 extending along the side wall 401a of the package 401.

Here, description will now be made in relation to a method for installing the flexible substrate 300 involved in a method of manufacturing of the transmitter 1.

For example, the method for installing the transmitter 1 may include the following steps 1) to 5) to be carried out in this sequence.

1) The package 401 is fixed to the rigid substrate 100.
2) The flexible substrate 300 is moved with respect to the package 401 such that the lead pin 4011, the protrusion 4012, and the protrusion 4013 penetrate the through-holes 3131-3133, respectively.
3) In a state where the surface 300b of the flexible substrate 300 on the positive side of the X axis is in contact with the side wall 401a, the lead pin 4011, the protrusion 4012, and the protrusion 4013 are electrically coupled to the flexible substrate 300 by soldering SL.
4) The terminals 3121-3123 of the flexible substrate 300 are inserted into the through-holes 1101-1103, respectively.
5) The terminals 3121-3123 of the flexible substrate 300 are electrically coupled to the rigid substrate 100 by soldering SL.

The steps 1) to 5) may be carried out in a different order from the above. However, the step 3) needs to be carried out after the step 2) and the step 5) needs to be carried out after the step 4).

(Operation)

Description will now be made in relation to operation of the transmitter 1.

The data generating circuit 10 generates data and outputs the generated data to the driving circuit 20. The driving circuit 20 generates a driving signal to drive the light modulator 40 on the basis of the data input from the data generating circuit 10. The driving circuit 20 outputs the generated driving signal to the light modulator 40 through the flexible substrate 300.

The light source 30 generates light and outputs the generated light to the light modulator 40. The light modulator 40 modulates the light input from the light source 30 on the basis of the driving signal input from the driving circuit 20, and transmits the modulated light to the receiver through the communication cable FB.

As described above, in the transmitter 1 of the first embodiment, the flexible substrate 300 couples the conductive layer 121 of the rigid substrate 100 to the lead pin 4011 of the package 401 by coupling the conductive layer 331 to the conductive layer 121 in the through-hole 1101. In other words, the flexible substrate 300 is coupled to the conductive layer 121 under a state where the conductive layer 331 is placed inside the through-hole 1101.

This configuration allows the conductive layer 331 of the flexible substrate 300, being in a state of not being bent, to be electrically coupled to the conductive layer 121 of the rigid substrate 100. Since this shortens the distance between the conductive layer 121 and the package 401 along the direction of the X axis, the area on the rigid substrate 100 for connecting the lead pin 4011 of the package 401 to the conductive layer 121 of the rigid substrate 100 can be small, which can achieve a compact transmitter 1, for example.

Figure 11:
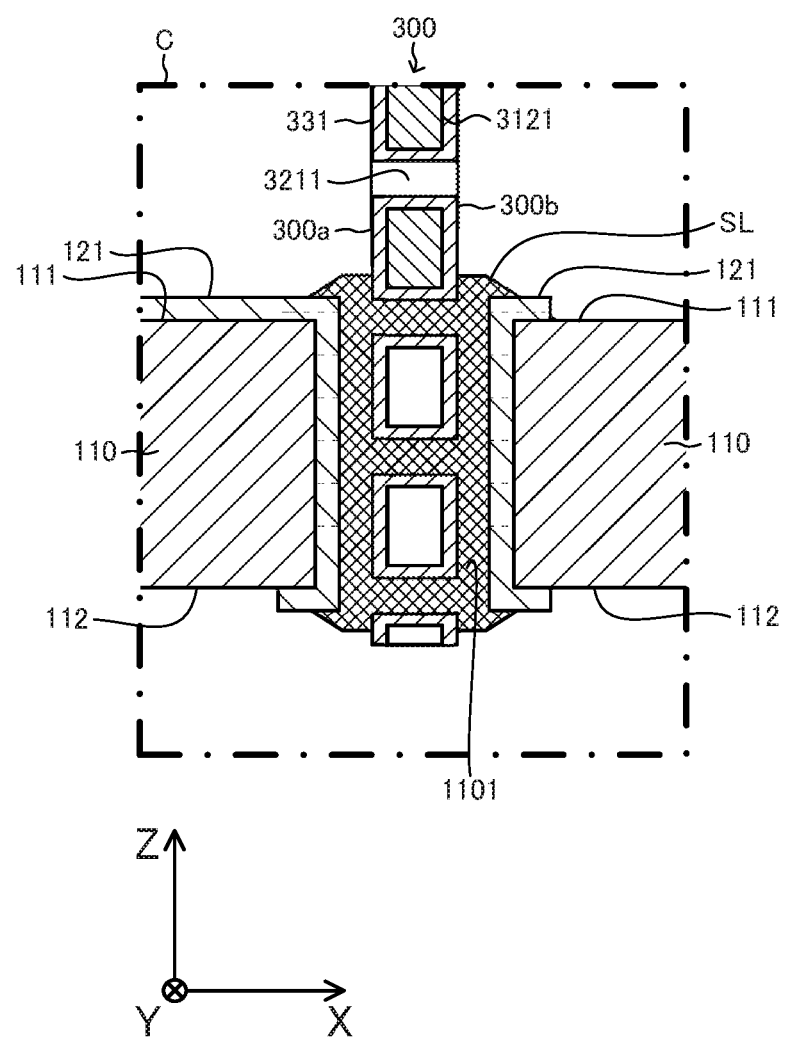
FIG. 11 is a diagram illustrating an example of a cross section of a transmitter according to a modification to the first embodiment, the cross section corresponding to that of FIG. 8.

Alternatively, as illustrated in FIG. 11, the end of the flexible substrate 300 in the direction of the Z axis may be a hollow. In other words, the end (i.e., the ends of the terminals 3121-3123) of the body 310 of the flexible substrate 300 in the negative side of the Z axis may be disposed on the positive side of the Z axis from the negative ends of the conductive layers 331 and 332 in the direction of the Z axis.

First Modification to First Embodiment

Next, description will now be made in relation to a transmitter according to a first modification to the first embodiment. The transmitter of the first modification to the first embodiment is different from the transmitter of the first embodiment in the point that the terminals have respective different widths. Hereinafter, description will focus on the difference.

Figure 12:
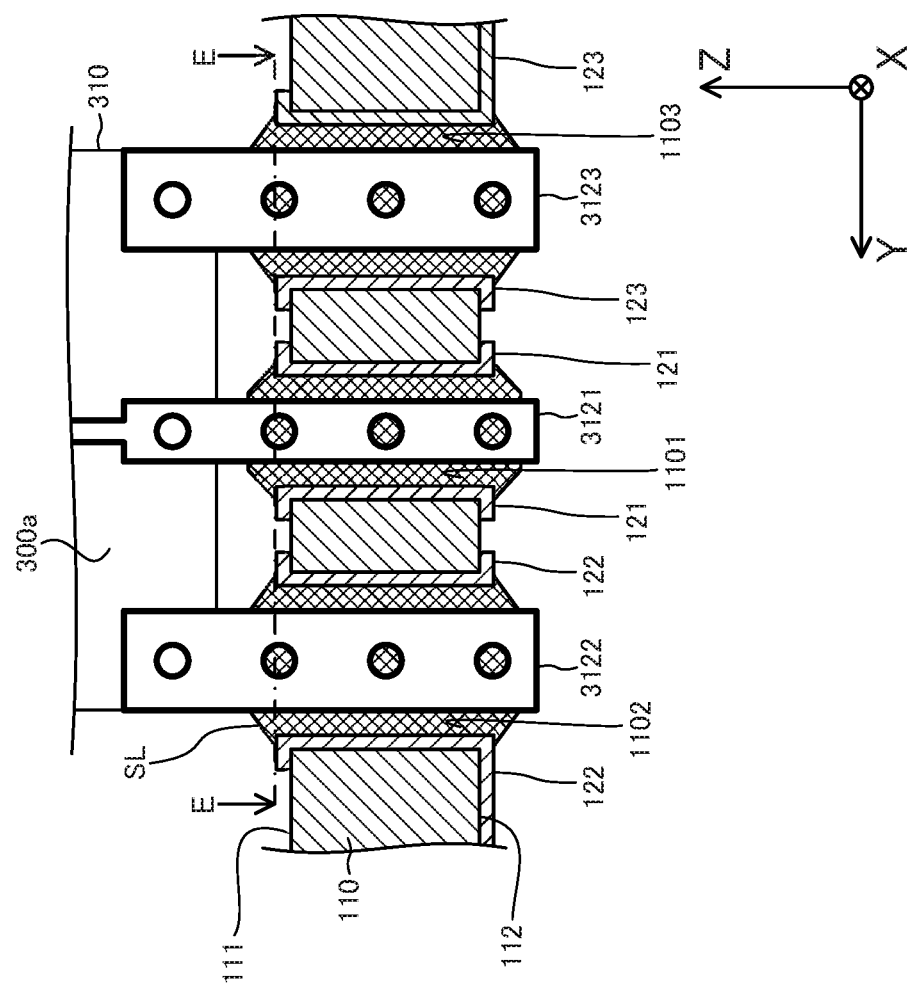
FIG. 12 is a diagram illustrating an example of a cross section of a transmitter according to a first modification to the first embodiment, the cross section corresponding to that of FIG. 9.
Figure 13:
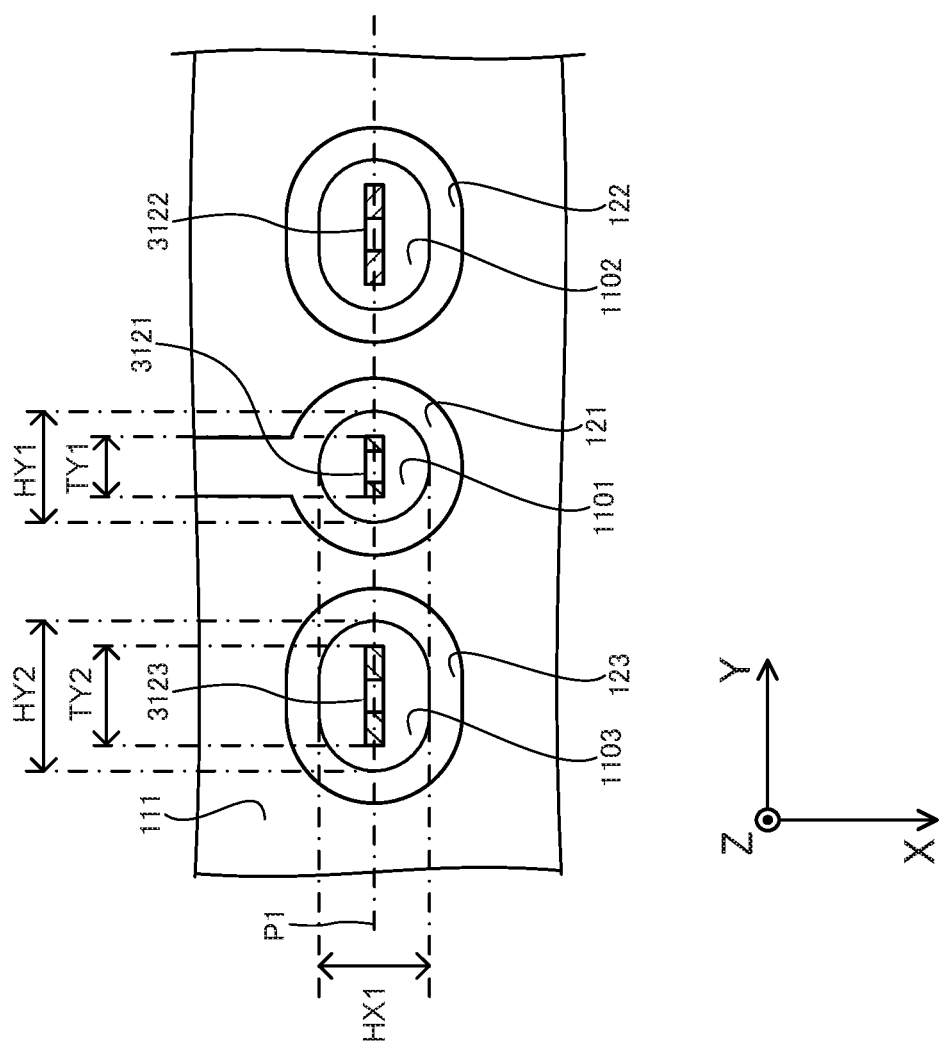
FIG. 13 is a diagram illustrating an example of a cross section of a transmitter of FIG. 12 cut by line E-E.

FIG. 12 illustrates a cross section of the transmitter 1 and corresponds to FIG. 9; and FIG. 13 illustrates a cross section of the transmitter 1 cut along the line E-E of FIG. 12. FIG. 13 omits illustration of soldering.

As illustrated in FIGS. 12 and 13, the length TY1 of the terminal 3121 in the direction of the Y axis is shorter than the length TY2 of the terminals 3122 and 3123 in the direction of the Y axis.

The length TY1 of the terminal 3121 in the direction of the Y axis may be referred to as the width of the terminal 3121; and the length TY2 of the terminals 3122 and 3123 in the direction of the Y axis may be referred to as the widths of the terminals 3122 and 3123.

As illustrated in FIGS. 12 and 13, the length HY1 of the through-hole 1101 in the direction of the Y axis is shorter than the length HY2 of the through-holes 1102 and 1103 in the direction of the Y axis. In contrast, the length HX1 of the through-hole 1101 in the direction of the X axis is the same as the length HX1 of the through-holes 1102 and 1103 in the direction of the X axis. Accordingly, the length HY2 of the through-holes 1102 and 1103 in the direction of the Y axis is longer than the length HX1 of the through-holes 1102 and 1103 in the direction of the X axis.

The length HY2 of the through-holes 1102 and 1103 in the direction of the Y axis is an example of the length of the openings of the through-holes 1102 and 1103 in a first direction along the plane P1 formed by the terminals 3121-3123. The length HX1 of the through-holes 1102 and 1103 in the direction of the X axis is an example of the length of the openings of the through-holes 1102 and 1103 in a second direction perpendicular to the plane P1 formed by the terminals 3121-3123.

The through-holes 1102 and 1103 have the areas of the cross sections cut along the XY plane (i.e., the areas of the openings of the through-holes 1102 and 1103) are larger than the area of the cross section of the through-hole 1101 cut along the XY plane (i.e., the area of the opening of the through-hole 1101).

As illustrated in FIG. 13, the cross sections of the through-holes 1102 and 1103 cut along the XY plane of this modification can be regarded as being in the shape of rounded rectangles.

The opening of the through-hole 1101 may be referred to as an opening of a first through-hole terminal; and the openings of the through-holes 1103 and 1102 may be referred to as openings of a fourth through-hole terminals.

In the first modification, the terminal 3121 covered with the conductive layer 331 coupled to the signal electrode 4034 has a width smaller than the widths of the terminals 3122 and 3123 covered with the conductive layer 332 coupled to the ground electrodes 4035 and 4036.

The capacitance between the conductive layer 331 and the conductive layers 332, 122, and 123 coupled to the ground electrodes 4035 and 4036 tends to be large. This may sometimes hinder the intrinsic impedance of the circuit of the rigid substrate 100 and the flexible substrate 300 from sufficiently approaching the target value (e.g., 50Ω), which results in that an RF signal is easily reflected to increase electric power loss caused from inputting a signal from the rigid substrate 100 into the package 401.

In contrast to the above, the transmitter 1 of the first modification makes capacitance between the conductive layer 331 and the conductive layers 332, 122, and 123 coupled to the ground electrodes 4035 and 4036 possible to be small. Consequently, the intrinsic impedance of the circuit of the rigid substrate 100 and the flexible substrate 300 can sufficiently approach the target value (e.g., 50Ω), so that electric power loss caused from inputting a signal from the rigid substrate 100 into the package 401 can be suppressed.

In addition, the areas of the conductive layer 332 used for coupling the conductive layers 122 and 123 to the conductive layer 332 can be increased. This means that the area of the conductive layer 332 that the soldering SL adheres to can be increased, so that the reliability of coupling can be enhanced.

Furthermore, in the first modification, the areas of the through-holes 1102 and 1103 coupled to the ground electrodes 4035 and 4036 have openings each of which has an area larger than that of the through-hole 1101 coupled to the signal electrode 4034.

This structure makes the terminals 3122 and 3123 covered with the conductive layer 332 coupled to the ground electrodes 4035 and 4036 to be easily inserted into the through-holes 1102 and 1103. Consequently, the package 401 can be easily coupled to the rigid substrate 100.

Second Modification to First Embodiment

Next, description will now be made in relation to a transmitter according to a second modification to the first embodiment. The transmitter of the second modification to the first embodiment is different in the shape of the openings of through-holes that accommodate conductive layers coupled to ground electrodes from the transmitter of the first embodiment. Hereinafter, description will focus on the difference.

Figure 14:
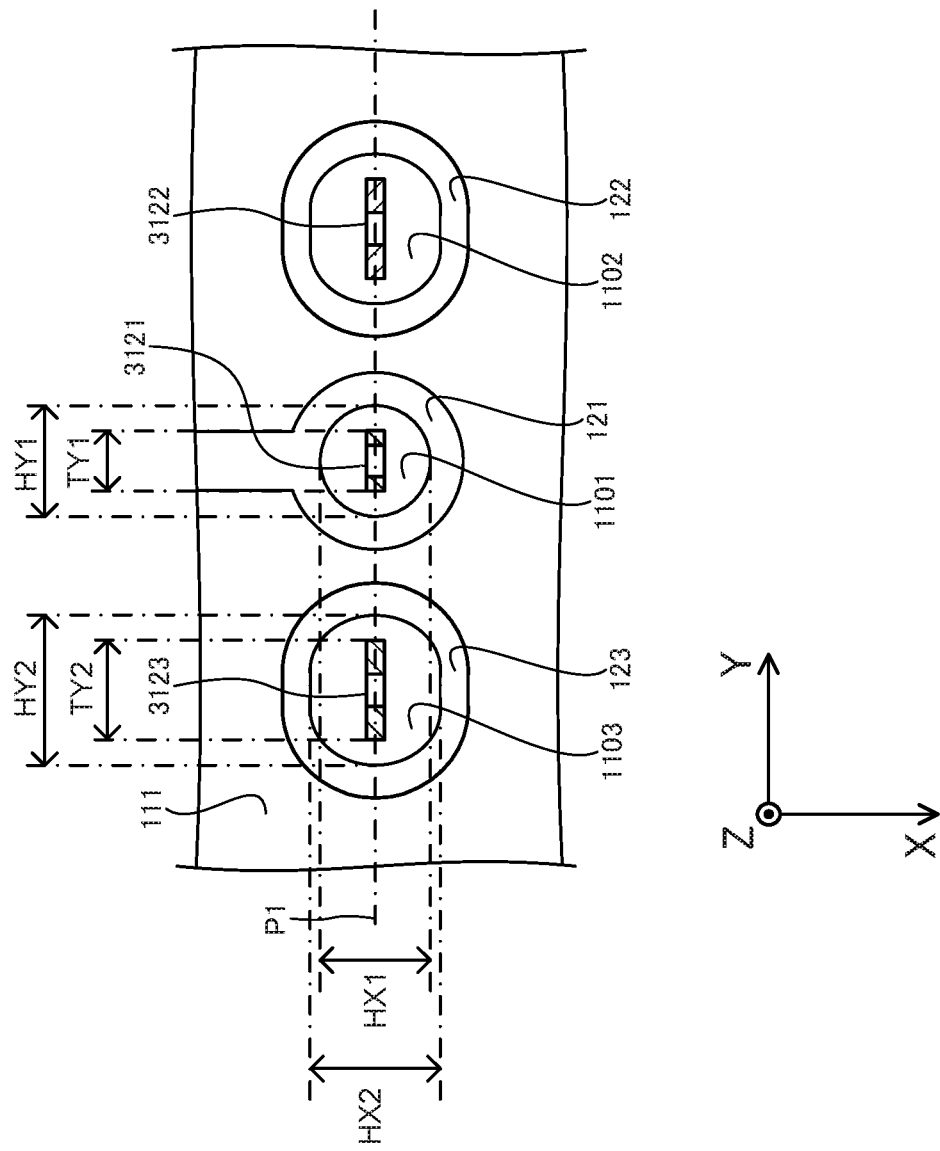
FIG. 14 is a diagram illustrating an example of a cross section of a transmitter according to a second modification to the first embodiment, the cross section corresponding to that of FIG. 13.

FIG. 14 illustrates a cross section of the transmitter 1 and corresponds to FIG. 13.

As illustrated in FIG. 14, the length HX2 of the through-holes 1102 and 1103 in the direction of the X axis is longer than the length HX1 of the through-hole 1101 in the direction of the X axis.

The length HX1 of the through-hole 1101 in the direction of the X axis is an example of the length of the opening of the through-hole 1101 in the direction perpendicular to the plane P1 formed by the terminals 3121-3123. The length HX2 of the through-holes 1102 and 1103 in the direction of the X axis is an example of the length of the openings of the through-holes 1102 and 1103 in the direction perpendicular to the plane P1 formed by the terminals 3121-3123.

This structure makes the terminals 3122 and 3123 covered with the conductive layer 332 coupled to the ground electrodes 4035 and 4036 to be easily inserted into the through-holes 1102 and 1103. Consequently, the package 401 can be easily coupled to the rigid substrate 100.

Third Modification to First Embodiment

Next, description will now be made in relation to a transmitter according to a third modification to the first embodiment. The transmitter of the third modification to the first embodiment is different from the transmitter of the first embodiment in the point that the terminals have respective different lengths in the extending direction. Hereinafter, description will focus on the difference.

Figure 15:
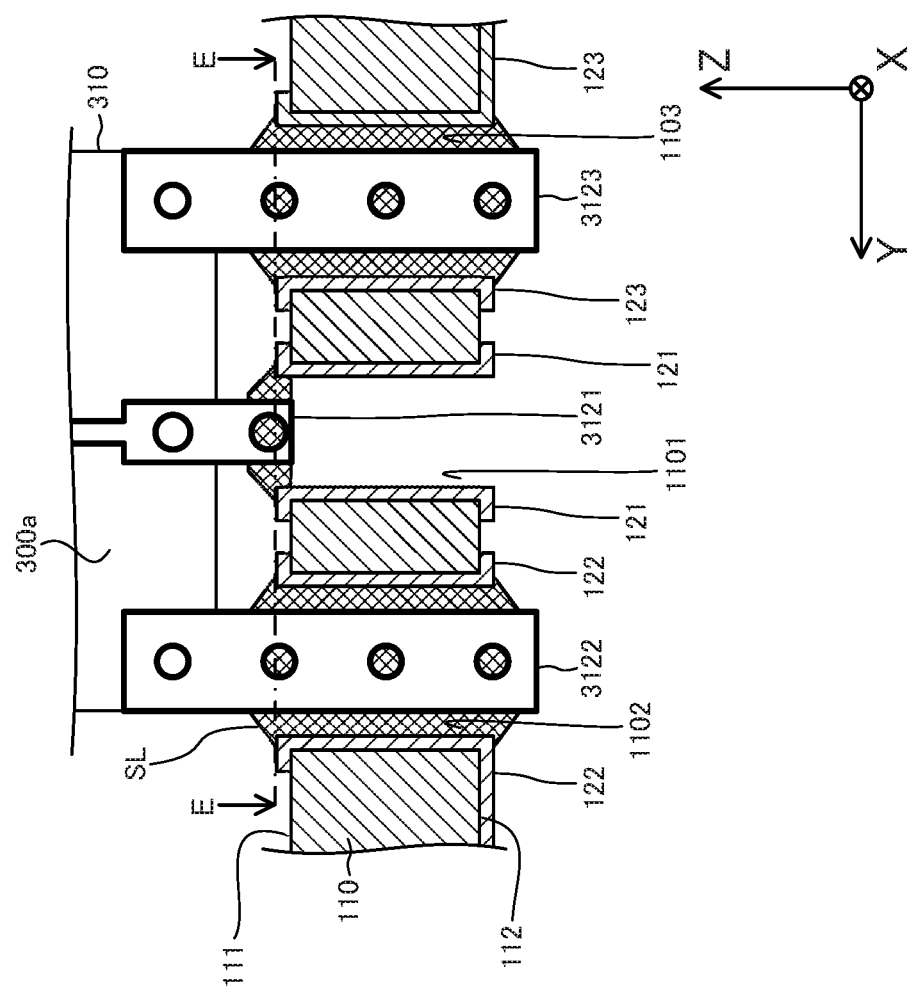
FIG. 15 is a diagram illustrating an example of a cross section of a transmitter according to a third modification to the first embodiment, the cross section corresponding to that of FIG. 12.

FIG. 15 illustrates a cross section of the transmitter 1 and corresponds to FIG. 12.

As illustrated in FIG. 15, the length of the terminal 3121 in the direction of the Z axis is shorter than the length of the terminals 3122 and 3123 along the Z axis. The length of the terminal 3121 in the direction of the Z axis may also be referred to as the length of the terminal 3121 in the extending direction.

In this modification, the tip on the negative side of the conductive layer 331 covering the terminal 3121 of the Z axis is positioned on a position towards the proximal face (in other words, proximate face) of the rigid substrate 100 to the package 401 from the distal face (in other words, distant face) of the rigid substrate 100 from the package 401. In this modification, the negative end of the conductive layer 331 covering the terminal 3121 of the Z axis is positioned the same as the position of the surface 111 of the body 110 on the positive side of the Z axis.

As detailed above, the tip of the conductive layer 331 of the third modification is positioned on a position towards the proximal face of the rigid substrate 100 to the package 401 from the distal face of the rigid substrate 100 from the package 401. In other words, the tip of the conductive layer 331 of the third modification is positioned on a position closer to the package 401 than a face of the rigid substrate 100 on the opposite side of the package 401.

This makes capacitance between the conductive layer 331 and the conductive layers 332, 122, and 123 coupled to the ground electrodes 4035 and 4036 possible to be small. Consequently, the intrinsic impedance of the circuit of the rigid substrate 100 and the flexible substrate 300 can sufficiently approach the target value (e.g., 50Ω), so that electric power loss caused from inputting a signal from the rigid substrate 100 into the package 401 can be suppressed.

Fourth Modification to First Embodiment

Next, description will now be made in relation to a transmitter according to a fourth modification to the first embodiment. The transmitter of the fourth modification to the first embodiment is different from the transmitter of the third modification of the first embodiment in the point that the wall defining the through-hole that accommodates the conductive layer coupled to the signal electrode is not covered with a conductive layer. Hereinafter, description will focus on the difference.

Figure 16:
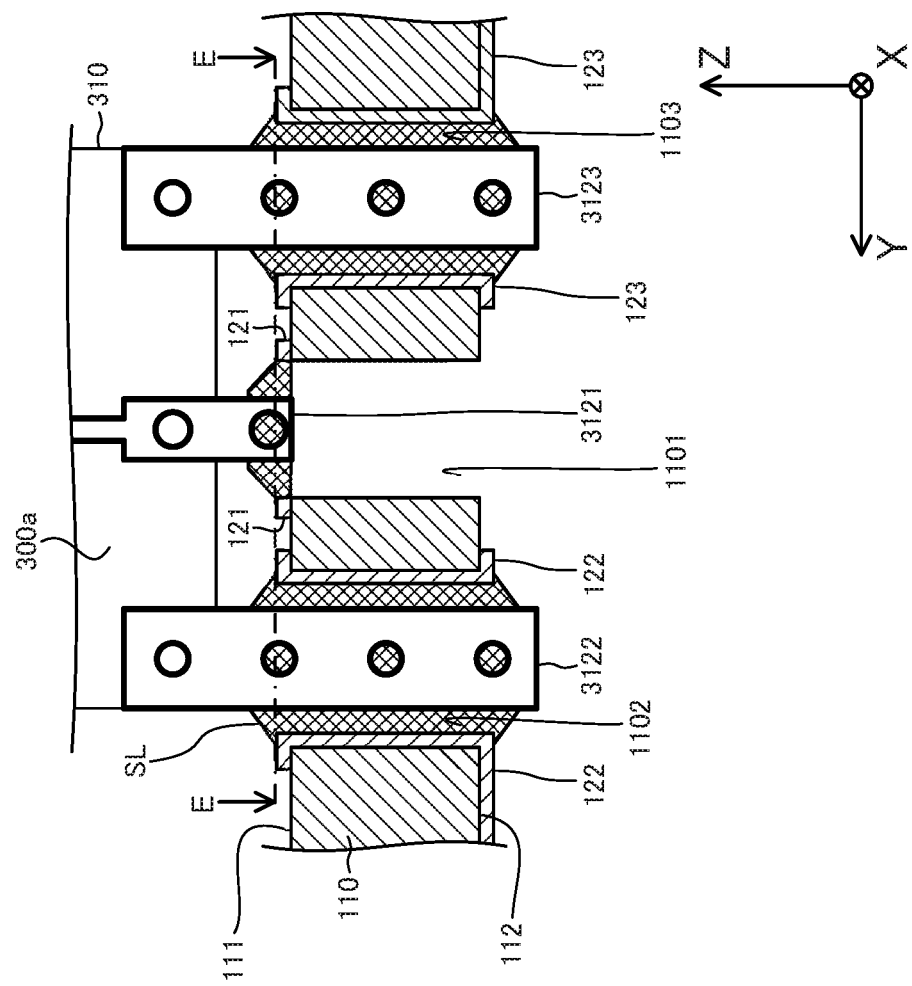
FIG. 16 is a diagram illustrating an example of a cross section of a transmitter according to a fourth modification to the first embodiment, the cross section corresponding to that of FIG. 15.

FIG. 16 illustrates a cross section of the transmitter 1 and corresponds to FIG. 15.

As illustrated in FIG. 16, the conductive layer 121 is positioned on a position towards the proximal face of the rigid substrate 100 to the package 401 from the distal face of the rigid substrate 100 from the package 401. In this modification, the conductive layer 121 is positioned on the positive side from the surface 111 of the body 110 of the Z axis but not positioned on the negative side from the surface 111 of the body 110 of the Z axis. For example, the conductive layer 121 does not cover the surface 112 of the body 110 on the negative side of the Z axis and the side wall of the body 110 defining the through-hole 1101.

In the fourth modification, the conductive layer 121 is positioned on a position towards the proximal face of the rigid substrate 100 to the package 401 from the distal face of the rigid substrate 100 from the package 401. In other words, the conductive layer 121 is positioned on a position closer to the package 401 than a face of the rigid substrate 100 on the opposite side of the package 401.

This makes capacitance between the conductive layer 121 and the conductive layers 332, 122, and 123 coupled to the ground electrodes 4035 and 4036 possible to be small. Consequently, the intrinsic impedance of the circuit of the rigid substrate 100 and the flexible substrate 300 can sufficiently approach the target value (e.g., 50Ω), so that electric power loss caused from inputting a signal from the rigid substrate 100 into the package 401 can be suppressed.

Fifth Modification to the First Embodiment

Next, description will now be made in relation to a transmitter according to a fifth modification to the first embodiment. The transmitter of the fifth modification to the first embodiment is different from the transmitter of the third modification to the first embodiment in the point that the openings of a through-holes on the rigid substrate have respective maximum lengths in the direction along the plane formed by the terminal at different positions with the through-holes. Hereinafter, description will focus on the difference.

Figure 17:
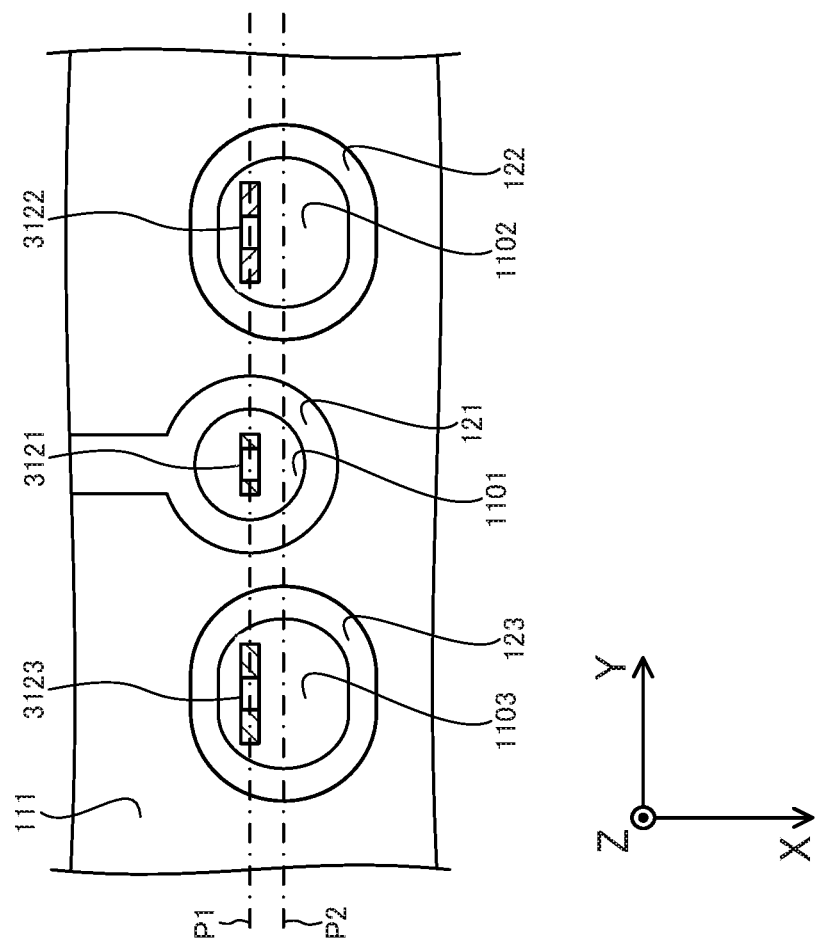
FIG. 17 is a diagram illustrating an example of a cross section of a transmitter according to a fifth modification to the first embodiment, the cross section corresponding to that of FIG. 13.

FIG. 17 illustrates a cross section of the transmitter 1 and corresponds to FIG. 13.

As illustrated in FIG. 17, the length along the Y axis the cross section (i.e., the opening) of the through-hole 1101 cut along the XY plane has the maximum value at a plane P1 (i.e., the plane along the side wall 401a) formed by terminals 3121-3123.

The cross sections (i.e., the openings) of the through-holes 1102 and 1103 cut along the XY plane have lengths along the Y axis having the maximum value on a plane P2 different from the plane P1 formed by the terminals 3121-3123. In this modification, the center of gravity of the cross sections of the through-holes 1102 and 1103 cut along the XY plane are positioned on the plane P2 different from the plane P1 formed by the terminals 3121-3123.

In this modification, the plane P2 is positioned on the positive side of the X axis from the plane P1. The direction along the Y axis is an example of a direction along the plane P1 formed by the terminals 3121-3123.

For example, the method for installing the transmitter 1 of the fifth modification may include the following steps 1) to 8) to be carried out in this sequence.

1) The package 401 is fixed to the rigid substrate 100.

2) The flexible substrate 300 is moved with respect to the package 401 such that the lead pin 4011, the protrusion 4012, and the protrusion 4013 penetrate the through-holes 3131-3133, respectively.

3) In a state where the surface 300b of the flexible substrate 300 on the positive side of the X axis is in contact with the side wall 401a, the lead pin 4011, the protrusion 4012, and the protrusion 4013 are coupled to the flexible substrate 300 by soldering SL.

4) The terminals 3122 and 3123 are moved with respect to the rigid substrate 100 so as to be positioned on the plane P2.

5) The terminals 3122 and 3123 of the flexible substrate 300 are inserted into the through-holes 1102 and 1103, respectively, in the direction along the plane P2.

6) The terminals 3122 and 3123 of the flexible substrate 300 are moved with respect to the rigid substrate 100 so as to be, in a state of being respectively positioned in the through-holes 1102 and 1103, positioned on the plane P1.

7) The terminal 3121 of the flexible substrate 300 is inserted into the through-hole 1101 in the direction along the plane P1.

8) The terminals 3121-3123 of the flexible substrate 300 are electrically coupled to the rigid substrate 100 by soldering SL.

The steps 1) to 8) may be carried out in a different order from the above. However, the step 3) needs to be carried out after the step 2) and the step 8) needs to be carried out after the step 7). Further, the steps 5), 6), and 7) need to be carried out after the steps 4), 5), and 6), respectively, As described above, in the fifth modification, the openings of the through-holes 1102 and 1103 have lengths along the direction of the plane P1 formed by the terminals 3121-3123 having the maximum values at the second plane P2 different from the second plane P2.

Consequently, since the terminals 3122 and 3123 are positioned on the second plane P2, the terminals 3122 and 3123 are easily inserted into the through-holes 1102 and 1103, respectively. This easily couples the conductive layer 332 covering the terminals 3122 and 3123 to the conductive layers 122 and 123 covering the through-holes 1102 and 1103, respectively.

After the terminals 3122 and 3123 are placed into the through-holes 1102 and 1103, the terminals 3122 and 3123 are moved onto the first plane P1, so that the terminal 3121 can be arranged on a straight line passing through a point at which the terminal 3121 is to be accommodated in the through-hole 1101 and extending along the Z axis. Consequently, the terminal 3121 can be easily inserted into the through-hole 1101. This easily couples the conductive layer 331 covering the terminal 3121 to the conductive layer 121 covering the through-holes 1101.

As illustrated in FIG. 18, the cross section (i.e., the opening) of the through-hole 1101 cut along the XY plane may be in the form of a rounded rectangle. In other words, the opening of the through-hole 1101 has a length along the Y axis that may be longer than the length of the opening the through-hole 1101 along the X axis.

This makes capacitance between the conductive layer 121 and the conductive layers 332, 122, and 123 coupled to the ground electrodes 4035 and 4036 possible to be small. Consequently, the intrinsic impedance of the circuit of the rigid substrate 100 and the flexible substrate 300 can sufficiently approach the target value (e.g., 50Ω), so that electric power loss caused from inputting a signal from the rigid substrate 100 into the package 401 can be suppressed.

As illustrated in FIG. 18, the cross sections (i.e., the openings) of the through-holes 1102 and 1103 cut along the XY plane each may be in a shape of two rounded rectangles arranged and coupled along the X axis.

Sixth Modification to First Embodiment

Next, description will now be made in relation to a transmitter according to a sixth modification to the first embodiment. The transmitter of the six modification to the first embodiment is different from the transmitter of the third modification to the first embodiment in the point that the respective lands of the through-holes have different widths. Hereinafter, description will focus on the difference.

FIG. 19 illustrates a cross section of the transmitter 1 and corresponds to FIG. 13.

As illustrated in FIG. 19, the conductive layer 121 on the outer circumference of the through-hole 1101 on the surface 111 of the body 110 in the positive side of the Z axis has a width W1 smaller than the width W2 of the conductive layers 112 and 123 on the outer circumferences of the through-holes 1102 and 1103 on the surface 111.

The width W1 of the conductive layer 121 on the outer circumference of the through-hole 1101 on the surface 111 of the body 110 in the positive side of the Z axis may also be referred to as the width of the land of the conductive layer 121. Likewise, width W2 of the conductive layers 122 and 123 on the outer circumferences of the through-holes 1102 and 1103 on the surface 111 of the body 110 in the positive side of the Z may also be referred to as the width of the conductive layers 122 and 123.

In this modification, the conductive layer 121 on the outer circumference of the through-hole 1101 on the surface 112 of the body 110 in the negative side of the Z axis has a width W1 also smaller than the width W2 of the conductive layers 112 and 123 on the outer circumferences of the through-holes 1102 and 1103 on the surface 112.

This makes capacitance between the conductive layer 121 and the conductive layers 332, 122, and 123 coupled to the ground electrodes 4035 and 4036 possible to be small. Consequently, the intrinsic impedance of the circuit of the rigid substrate 100 and the flexible substrate 300 can sufficiently approach the target value (e.g., 50Ω), so that electric power loss caused from inputting a signal from the rigid substrate 100 into the package 401 can be suppressed.

Alternatively, the light modulator 40 of the above embodiment and modifications may generate a modulated light signal in a multi-value modulation scheme using multiple (e.g., two or four) Mach-Zehnder interferometers. In this alternative, the multiple Mach-Zehnder interferometers may be arranged in parallel. Further alternatively, the light modulator 40 may generate a modulated light signal in a polarization multiplexing scheme using multiple (e.g., two or four) Mach-Zehnder interferometers. In this alternative, the number of through-holes, the number of terminals of the flexible substrate 300 and the number of through-holes of the rigid substrate 100 may be varied with the number of driving signals input into the light modulator 40.

As an alternative to the above embodiment and modifications, the transmitter 1 may include another rigid substrate in place of the flexible substrate 300 and couples the terminals of the rigid substrate 100 and the terminals of the package 401 via the other rigid substrate.

In place of the soldering of the above embodiment and modifications, the conductive layers may be coupled to each other by material (e.g., conductive adhesive) different from soldering.

The technique to couple terminals of the package 401 to the terminals of the rigid substrate 100 may be applied, in place of the transmitter 1, to a receiver that receives a light signal or to a light relay that relays a light signal. For example, a light receiver includes a signal processor that carries out a process of receiving a light signal; and the light relay includes a first signal processor that carries out a process of transmitting a light signal and a second signal processor that carries out a process of receiving a light signal. Further alternatively, the technique to couple terminals of the package 401 to the terminals of the rigid substrate 100 may be applied to a device that processes a signal except for a light signal.

The disclosed technique reduces an area of a region on a rigid substrate used for coupling terminals of a package and terminals of a rigid substrate.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A light transmitter-receiver comprising:
a signal processor that carries out a process of transmitting or receiving a light signal;
a rigid substrate that is in a plate shape and that has a first through-hole terminal;
a package that is fixed to the rigid substrate, the package that accommodates the signal process and includes a second terminal disposed on a side wall of the package and electrically coupled to the signal processor, the first through-hole terminal is disposed on a proximal face of the rigid substrate that faces the package; and
a flexible substrate that extends along the side wall of the package in a state of being in direct contact with the side wall of the package, and that includes a third terminal disposed at a first tip of the flexible substrate and electrically coupled to the second terminal, the third terminal being coupled to the first through-hole terminal in a state where the third terminal is placed in the first through-hole terminal, and a tip of the third terminal is disposed towards the proximal face of the rigid substrate that faces the package from a distal face of the rigid substrate from the package, so that the third terminal is disposed closer to the package than a face of the rigid substrate on opposite side of the package to make small a capacitance between a conductive layer forming a first terminal corresponding to the third terminal and a corresponding ground electrode.

2. The light transmitter-receiver according to claim 1, wherein the first through-hole terminal accommodates at least part of the third terminal on a plane extending along the side wall.

3. The light transmitter-receiver according to claim 1, wherein:
the rigid substrate includes a second through-hole terminal;
the flexible substrate includes a fourth terminal that is disposed on a second tip of the flexible substrate and that is electrically coupled to the ground electrode included in the signal processor, the fourth terminal being coupled to the second through-hole terminal in a state where the fourth terminal is placed in the second through-hole terminal; and
the third terminal has a width smaller than a width of the fourth terminal.

4. The light transmitter-receiver according to claim 3, wherein the second through-hole terminal has an opening having an area larger than an area of an opening of the first through-hole terminal.

5. The light transmitter-receiver according to claim 3, wherein at least one of the first through-hole terminal or the second through-hole terminal has an opening having a first length in a first direction along a plane formed by the third terminal and the fourth terminal, the first length being longer than a length of the opening in a second direction perpendicular to the plane.

6. The light transmitter-receiver according to claim 3, wherein the second through-hole terminal has an opening having a second length in a direction perpendicular to a plane formed by the third terminal and the fourth terminal, the second length being longer than a length of an opening of the first through-hole terminal in the direction perpendicular to the plane.

7. The light transmitter-receiver according to claim 3, wherein the second through-hole terminal has an opening having a third length in a direction along a first plane formed by the third terminal and the fourth terminal, the third length having a maximum value on a second plane different from the first plane among lengths of directions along the first plane.

8. The light transmitter-receiver according to claim 3, wherein
the first through-hole terminal has a landing having a first width and forming an outer circumference of the first through-hole on the face of the rigid substrate in contact with the package,
the second through-hole terminal has a landing having a second width and forming an outer circumference of the second through-hole on the face of the rigid substrate in contact with the package, and
the first width is smaller than the second width.

9. The light transmitter-receiver according to claim 1, wherein the signal processor is a modulator that modulates, based on an electric signal input from the rigid substrate, light.

* * * * *